United States Patent [19]

Huang

[11] Patent Number: 5,268,594
[45] Date of Patent: Dec. 7, 1993

[54] CASCADABLE MULTI-PULSE GENERATOR FOR GENERATING ONE-SHOT PULSE AND DELAYED TRIGGERED SIGNAL

[75] Inventor: Po-Chuan Huang, Hsinchu, Taiwan

[73] Assignee: Industrial Technology Research Institute, Hsinchu

[21] Appl. No.: 876,666

[22] Filed: Apr. 30, 1992

[51] Int. Cl.$^5$ .................. H03K 3/017; H03K 5/04
[52] U.S. Cl. .................... 307/265; 307/273; 328/58
[58] Field of Search ............ 307/265, 273, 605, 608; 328/58

[56] References Cited

U.S. PATENT DOCUMENTS

| | | | |
|---|---|---|---|
| 3,713,145 | 1/1973 | Butler et al. | 307/273 |
| 4,583,008 | 4/1986 | Grugett | 307/265 |
| 4,846,579 | 7/1989 | Tomimatsu et al. | 307/273 |
| 5,006,725 | 4/1991 | Nawaki et al. | 307/273 |
| 5,163,168 | 11/1992 | Hirano et al. | 307/265 |

Primary Examiner—William L. Sikes
Assistant Examiner—Toan Tran
Attorney, Agent, or Firm—Meltzer, Lippe, Goldstein

[57] ABSTRACT

A cascadable multi-pulse generator stage for generating a one-shot pulse signal and a delayed trigger signal is disclosed. The cascadable multi-pulse generator stage includes a first pulse signal generator for generating a first one-shot pulse signal in response to an external trigger signal inputted to the cascadable multi-pulse generator stage. The cascadable multi-pulse generator stage also includes a second pulse signal generator, responsive to the first pulse signal generator, for generating a second one-shot pulse signal delayed from the first one-shot pulse signal by a fixed internal delay. Lastly, the stage includes a trigger signal generator, responsive to the first and second pulse signal generators, for generating a trigger pulse, having a period approximately equal to the sum of the periods of the first and second pulse signals. The one-shot pulse and trigger pulse signals serve for generating the one-shot and trigger outputs of the stage.

7 Claims, 4 Drawing Sheets

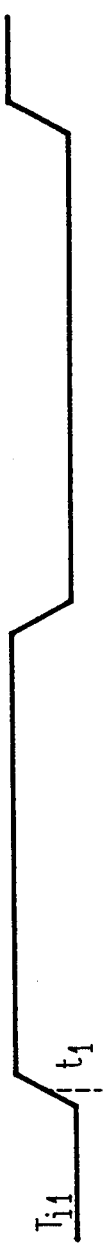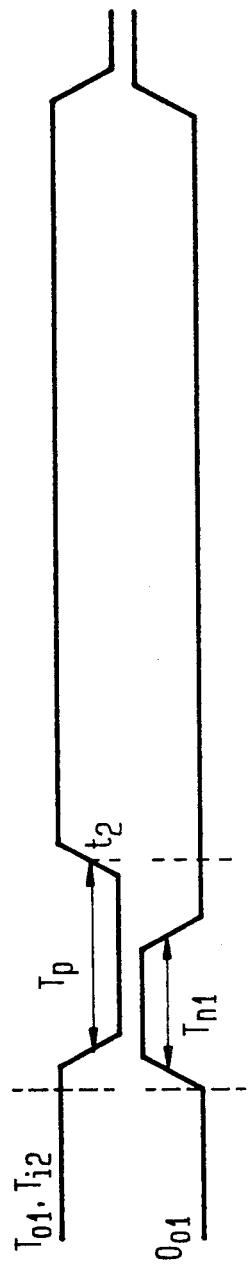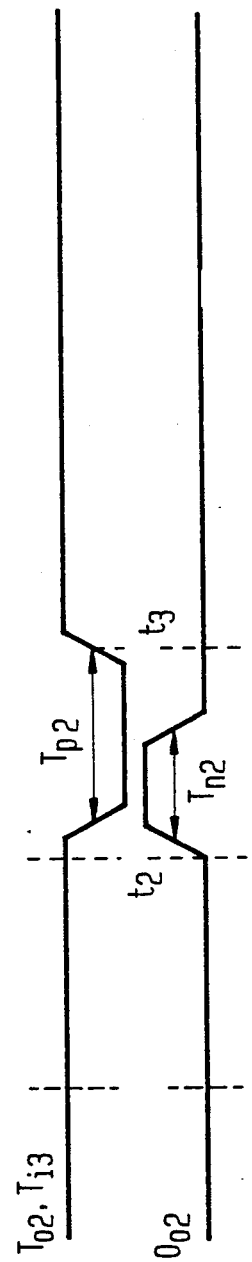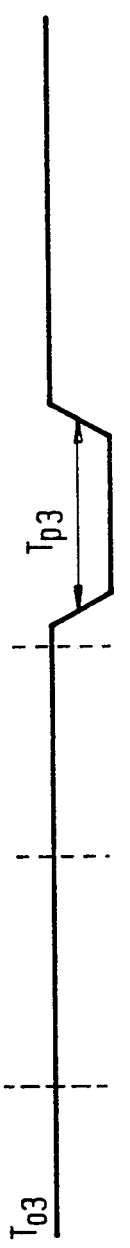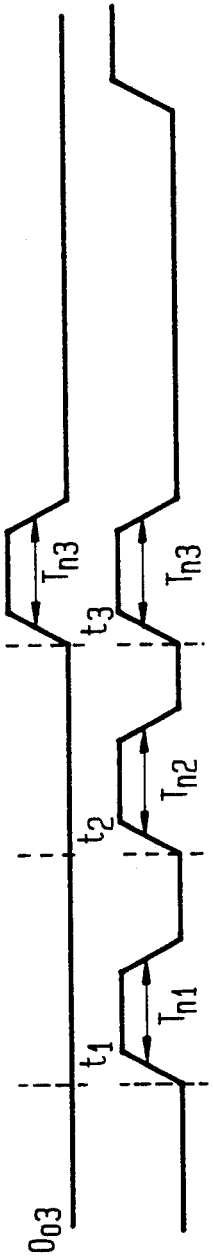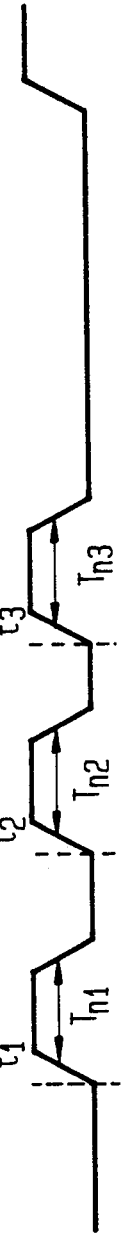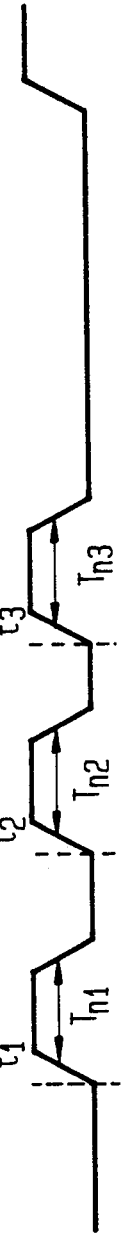
FIG. 4a
FIG. 4b
FIG. 4c
FIG. 4d
FIG. 4e
FIG. 4f
FIG. 4g
FIG. 4h

CASCADABLE MULTI-PULSE GENERATOR FOR GENERATING ONE-SHOT PULSE AND DELAYED TRIGGERED SIGNAL

FIELD OF THE INVENTION

The present invention relates to digital circuits, and more particularly, to a multi-pulse signal generator whose individual stages comprise cascaded one-shot circuits for use in synchronous systems.

BACKGROUND OF THE INVENTION

Digital circuit components may be connected together in synchronous circuits whereby processing is performed in reference to one or more clock signals. In many applications, only one clock signal is used as a reference for processing because of the system's characteristics and/or because of cost considerations. Often, some of the integrated circuits of the systems cannot possibly operate at their full capacity when only one clock is used. This is especially true in light of recent strides in IC fabrication which have produced logic gates with propagation delay times much smaller than the clock cycle of the system clock. As such, the logic gate is mostly idle between processing steps as it awaits the next clock cycle of the system clock. Unless the system is redesigned to operate in an asynchronous manner, its efficiency may only be increased by increasing the speed of the system clock.

In a fully optimized system, several different avenues are available for increasing the system clock frequency, but most require complicated circuit designs. However, one avenue, which utilizes one-shot circuits, is less complex than most of the other avenues and requires the least amount of surface space.

The one-shot circuit is a mono-stable circuit which has one stable state and one quasi-stable state. In other words, a one-shot circuit, after being placed in its stable state will remain in that state indefinitely. However, if the one-shot circuit is placed in its quasi-stable state, it will remain in the quasi-stable state for only a fixed time before reverting to its stable state.

The prior art has largely avoided the use of one-shot circuits for optimizing system clocks because of its sensitivity to changes in the environment and process. Such short comings render one-shot circuits difficult to cascade. The one-shot signal output is further difficult to delay using a series of daisy-chained inverters as the resulting output pulse width is non-uniform. Further, the pulse amplitude often effectively disappears after two or three delay units of the daisy-chained inverters.

It is therefore an object of the present invention to provide a multi-pulse signal generator whose individual stages comprise cascaded one-shot circuits and which is capable of producing a one-shot pulse delayed from the trigger signal by a relatively long delay period.

SUMMARY OF THE INVENTION

These and other objects are achieved by the present invention which provides a cascadable multi-pulse generator stage for generating a one-shot pulse signal and a delayed trigger signal. The cascadable multi-pulse generator stage includes a first one-shot pulse signal generator for generating a first one-shot pulse signal in response to an external trigger signal which is inputted to the stage. This first one-shot pulse signal serves for the generation of a one-shot pulse output of the multi-pulse generator stage. Additionally, the cascadable multi-pulse generator stage includes a second one-shot pulse signal generator, which receives an output of the first pulse signal generator as an input. The second pulse generator is provided for generating a second one-shot pulse signal which is delayed from the first one-shot pulse signal by a fixed internal delay. Lastly, the multi-pulse generator stage includes a trigger signal generator which receives the first and second pulse signals as inputs. The trigger signal generator is provided for generating a trigger pulse having a period approximately equal to the sum of the periods of the first and second one-shot pulse signals of the first and second pulse signal generators. This trigger pulse signal serves for the generation of the trigger pulse output of the multi-pulse generator stage.

In an illustrative arrangement, two or more multi-pulse generator stages are cascaded. In such a case, the trigger output of each preceding stage is connected to the trigger input of its antecedent stage. Each stage operates, individually, in a similar fashion. However, on account of the interconnection of precedent stage trigger outputs to antecedent stage trigger inputs, each antecedent stage illustratively generates its one-shot and trigger output pulses after the end of the trigger output pulse of its precedent stage. Illustratively, by using the one-shot pulse output of the last stage, a one-shot signal may be obtained which is approximately delayed by the sum of the output trigger pulse widths of the stages which precede the last stage. In addition, the one-shot pulse outputs of the stages may be superimposed to form a pulse train which can be used as a clock signal.

BRIEF DESCRIPTION OF THE DRAWINGS

FIGS. 4(a)–(h) are timing diagrams illustrating the operation of a cascaded multi-pulse generator comprising three of the stages depicted in FIG. 1.

DETAILED DESCRIPTION OF THE INVENTION

Figure 1:
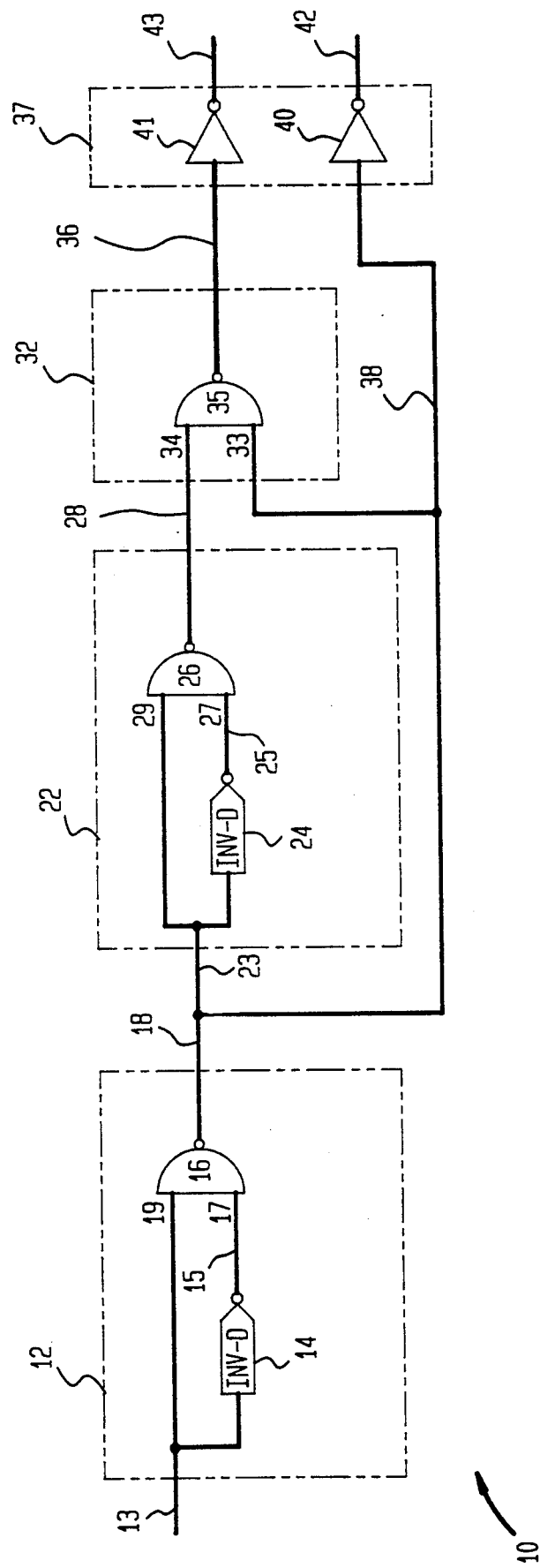
FIG 1 schematically depicts one stage of a cascadable multi-pulse generator stage according to the present invention.

An exemplary cascadable multi-pulse generator stage 10 is depicted in FIG. 1. The multi-pulse generator stage 10 has first and second one-shot pulse generators 12, 22 and a trigger signal generator 32 connected in tandem. Each one-shot pulse generator 12, 22 comprises a inverter-delay circuit 14, 24 which has an output line 15, 25 connected to one input terminal 17, 27 of a NAND gate 16, 26. The input terminal of each inverter-delay circuit 14, 24 is respectively connected to the corresponding input line 13, 23 of the one-shot pulse generators 12, 22. Each one-shot pulse generator input line 13, 23 is additionally connected to another input terminal 19, 29 of the NAND gate 16, 26 respectively comprised therein. The output line 18, 28 of each NAND gate 16, 26 serves as the output of the respective one-shot pulse generator 12, 22.

The input line 13 of the first one-shot pulse generator 12 is connected to an external trigger source. The output line 18 of the first one-shot pulse generator 12 is connected to the input line 23 of the second one-shot pulse generator, an input terminal 33 of the trigger signal generator 32 and an input line 38 of an output driver circuit 37. The output line 28 of the second one-shot pulse generator 22 is connected to a second input terminal 34 of the trigger signal generator 32. Illustratively, the signals of the two input terminals 33, 34 are NANDed in a NAND gate 35 and then outputted on line 36 which serves as an output line of the trigger signal generator 32.

The output line 36 is connected to a second input terminal 39 of the output driver circuit 37. Each input terminal 38, 39 is respectively associated with a corresponding inverter 40, 41. The output line 42 of the inverter 40 serves as a one-shot signal output line of the multi-pulse generator stage 10. The output line 43 of the other inverter 41 serves as the trigger signal output line of the multi-pulse generator stage 10.

Figure 2:
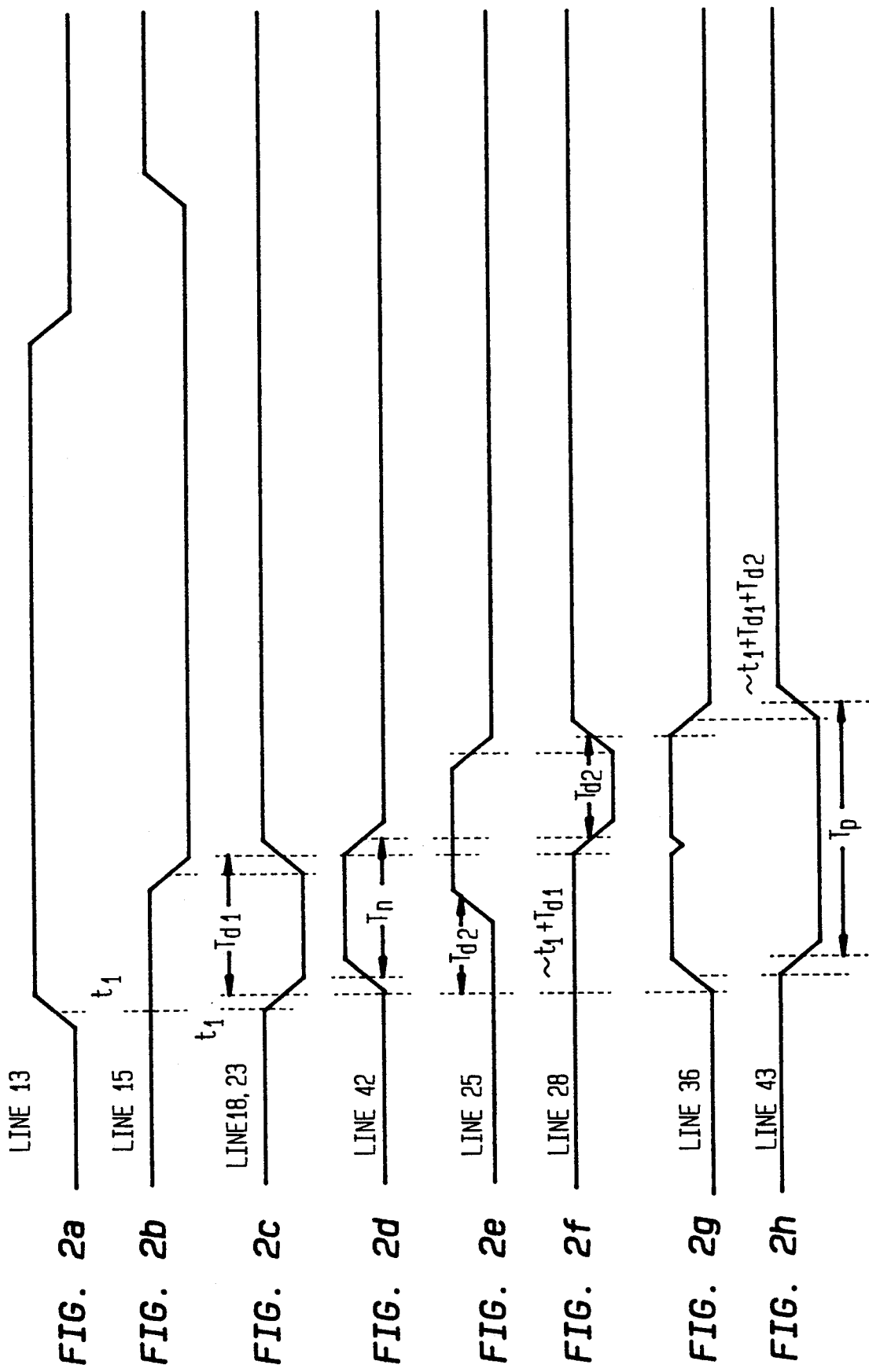
FIGS. 2(a)–(h) are timing diagrams illustrating the operation of the stage depicted in FIG. 1.

The operation of the multi-pulse generator stage 10 is now discussed in greater detail with reference to FIGS. 1, 2(a)–2(h). The wave form depicted in FIG. 2(a) is the external trigger signal which appears on the input line 13. Illustratively, the signal is initially low (logic zero). Thus, the first input terminal 19 of the NAND gate 16 receives a logic zero and the second input terminal 17 receives a logic one. As such, a logic one appears on the output line 18 of the first one-shot pulse generator 12.

At a time $t_1$, the external trigger signal goes high. This signal is inputted to the inverter-delay circuit 14 and directly to the first input terminal 19 of the NAND gate. As depicted in FIG. 2(b), the inverter-delay circuit 14 has a propagation delay time $T_{d1}$. For the time period $t_1$ to $t_1+T_{d1}$ the value output on line 15 does not change. Thus, during this brief interval, the second input terminal 17 also receives a logic one. After the time $t_1+T_{d1}$, the inverted output, i.e. a logic zero, appears on line 15. As a result of the above, between the periods $t_1$ and $t_1+T_{d1}$ the input terminals 19 and 17 each receive a logic one resulting in a logic zero appearing on line 18. At all other times, a logic one appears on line 18. The resulting output wave form of the first one-shot pulse generator 12 is depicted in FIG. 2(c).

The output of the first one-shot pulse generator 12 is fed to the output driver 37 and the resulting inverted output wave form appears on line 42 shortly after the pulse appears on line 18. This output pulse serves as the one-shot pulse output of the stage 10 and is depicted in FIG. 2(d). As depicted in FIG. 2(d), the one-shot pulse output is ordinarily a logic zero with a logic one impulse of width designated by $T_n$ where $T_n=T_{d1}$. Additionally, the aforementioned signal of line 18 serves as the input signal to the second one-shot pulse generator 22.

The second one-shot pulse generator 22 is similar in design to the first one-shot pulse generator 12 but is operated differently. Under initial conditions, i.e., before the time $t_1$, a logic one appears on line 18 (assuming that a logic zero appears on the trigger input line 13 at this time). As such, the input terminals 29 and 27 respectively receive a logic one and a logic zero resulting in a logic one being output on line 28 (see FIG. 2(f)). When the pulse of line 18 appears approximately between the times $t_1$ and $t_1+T_{d1}$ on line 23, the input terminal 29 immediately receives a logic zero. With two logic zero inputs to the NAND gate 26 there is no change in the output as shown in FIG. 2(f). Invariably, the inverter-delay circuit 24 outputs the complement of this pulse as depicted in FIG. 2(e), i.e. a logic one, but again, the output of the NAND gate 26 does not change (see FIG. 2(f)).

At approximately the time $t_1+T_{d1}$ the impulse on line 23 returns to a logic one. The input terminal 29 immediately receives this value. The signal inputted to terminal 27, however, remains at logic one until this change in the input signal on line 23 has propagated through the inverter-delay circuit 24. Thus, for a brief interval, the second NAND gate 26 receives a logic one at both of its input terminals 29, 27 resulting in a logic zero output on line 28. Assuming that the second inverter-delay circuit 24 has a propagation delay of $T_{d2}$, a logic zero appears on line 28 between approximately $t_1+T_{d1}$ and approximately $t_1+T_{d1}+T_{d2}$. Otherwise, a logic one is outputted on line 28. This output signal serves as the output of the second one-shot pulse generator 22 and is depicted in FIG. 2(f).

Both outputted one-shot pulse signals are fed to a respective input terminal 33, 34 of a trigger signal generator 32 which comprises a third NAND gate 35. Illustratively, under the initial conditions mentioned above, a logic one is inputted to both terminals 33, 34. Thus, as depicted in FIG. 2(g), a logic zero is initially outputted on line 36.

When the value output of either one-shot pulse generator output line 18 or 28 (or both) changes to a logic zero, the output signal of the trigger pulse generator 32 changes to a logic one. By examining the wave forms graphed in FIGS. 2(c) and 2(f) of both output lines 18, 28, it may be appreciated that the falling edge of the signal of line 28 approximately coincides with the rising edge of the wave form of line 18. Thus, the conditions for driving the trigger generator 32 to a logic one are roughly continuous from the falling edge of the impulse which appears on line 18 through the rising edge of the impulse which appears on line 28. The resulting output signal on line 36 of the trigger signal generator 32 is therefore an impulse which begins at approximately $t_1$ and ends at approximately $t_1+T_{d1}+T_{d2}$. This output is depicted in FIG. 2(g).

The signal of line 36 is fed to the output driver which outputs the complement of the trigger signal on line 43. This output serves as the trigger signal output of the multi-pulse generator stage 10. As depicted in FIG. 2(h), a logic one ordinarily appears on line 43. Between $t_1$ and $t_1+T_p$, however, a logic zero pulse appears on line 43 where $T_p$ designates the pulse width of the trigger pulse and is equal to $T_{d1}+T_{d2}$.

It may be appreciated that the pulse widths $T_n$ and $T_p$ may be adjusted by varying the delays $T_{d1}$, $T_{d2}$ of the inverter-delays 14, 24. Illustratively, $T_{d2}$ is set to be shorter than $T_{d1}$. The construction of the inverter-delays is described in greater detail below.

Figure 3:
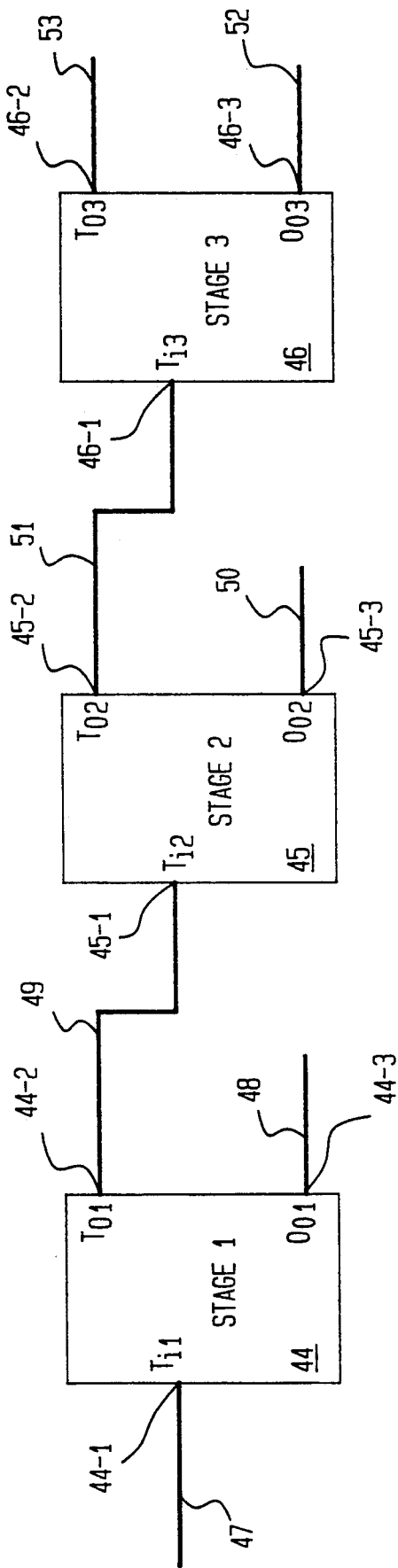
FIG. 3 schematically depicts an exemplary cascade of three of the stages depicted in FIG. 1.

Referring now to FIG. 3 an illustrative arrangement of three multi-pulse generator stages 44–46 is depicted. Each stage 44, 45 or 46 is similar to the stage 10 of FIG. 1. The trigger input terminals ($T_{i1}$–$T_{i3}$) are labeled 44-1, 45-1 and 46-1 and the trigger output terminals ($T_{o1}$–$T_{o3}$) are labeled 44-2, 45-2 and 46-2. As depicted in FIG. 3, the trigger output terminal ($T_{o1}$ or $T_{o2}$) 44-2 or 45-2 of each preceding stage 44 or 45 is fed to the trigger input terminal ($T_{i2}$ or $T_{i3}$) 45-1 or 46-1 of its respective, anteceding stage 45 or 46. In this fashion, the first stage 44 is cascaded to the second stage 45 by the line 49 and the second stage is cascaded to the third stage by the line 51.

Each stage also has a one-shot output signal terminal ($O_o$) labeled 44-3, 45-3 or 46-3 ($O_{o1}$, $O_{o2}$ or $O_{o3}$) which outputs the one-shot pulse signal of the respective stage 44-46 on the line 48, 50 or 52. Illustratively, the trigger input line 47 ($T_{i1}$) to the first stage 44 serves as the multi-pulse generator input line and the third stage one-shot output ($O_{o3}$) and trigger output ($T_{o3}$) lines 52 and 53 serve, respectively as the one-shot signal and trigger signal lines.

Referring now to FIGS. 3-4, the operation of the multi-pulse generator will now be described in greater detail. The first three graphs of FIGS. 4(a)-(c) ($T_{i1}$, $T_{o1}$ and $O_{o1}$) correspond to the trigger input, trigger signal output and one-shot pulse signal output of the aforementioned multi-pulse generator stage 10 (FIG. 1) as depicted in FIGS. 2(a), 2(h) and 2(d). As these signals have been previously described, their inter-relationship will not be repeated for purposes of brevity.

An examination of the signal outputted from $T_{o1}$ reveals that it is similar in shape to the signal of $T_{i1}$, i.e., it may be envisioned as a logic zero signal followed by a long logic one pulse. As such, $T_{o1}$ outputs a signal to the trigger input terminal of the second stage $T_{i2}$ which operates similar to the trigger input signal to the first stage $T_{i1}$. In other words, the rising edge of the signal output from $T_{o1}$ (the signal input to $T_{i2}$) triggers the second stage 45 to output a one-shot impulse beginning approximately at the time designated as $t_2$ in FIGS. 4(b) and 4(e) and ending approximately at $t_2 + T_{n2}$ where $t_2 \approx t_1 + T_{p1}$ and where $T_{p1}$ and $T_{n2}$ respectively designate the pulse widths of the first stage trigger signal depicted in FIG. 4(b) and second stage one-shot impulse signal depicted in FIG. 4(e). In a similar fashion, the falling edge of a trigger impulse at the second stage trigger output terminal $T_{o2}$, having a width designated as $T_{p2}$, appears approximately at $t_2$ as depicted in FIG. 4(d).

Continuing to stage three 46, it may be appreciated that the trigger output pulse $T_{o2}$ of the second stage 45, which appears on line 51, may serve as a third stage 46 trigger input $T_{i3}$ in an equivalent fashion to the triggers $T_{i1}$, $T_{i2}$ of lines 47 or 49 (see FIG. 4(d)). As such, the rising edge of an impulse appears at the third stage one-shot output terminal $O_{o3}$ at the time designated in FIG. 4(g) as $t_3$ (where $t_3 \approx t_1 + T_{p1} + T_{p2}$) and has a width designated as $T_{n3}$. Similarly, the falling edge of an impulse at trigger output $T_{o3}$ appears at $t_3$ having a width designated as $T_{p3}$ as depicted in FIG. 4(f). Although the respective one-shot pulse signals and trigger signals are depicted as being equal, $T_{n1}$, $T_{n2}$, $T_{n3}$, $T_{p1}$, $T_{p2}$ and $T_{p3}$ may all be adjusted by adjusting the delay times of the inverters used within each stage 44-46.

It may be appreciated that since the one-shot pulse output is taken from the last stage and that since the pulse is generated within that stage, the pulse is fairly uniform. As such, any number of stages may be cascaded to produce an appropriate one-shot pulse. It may be appreciated that for an $i^{th}$ stage, the falling edge of the trigger pulse and rising edge of the one-shotpulse occur at the time:

$$t_i = t_1 + \sum_{i=1}^{i-1} T_{pj}$$

Again, any pulse width time $T_{ni}$ or $T_{pi}$ of an $i^{th}$ stage may be easily adapted by adjusting the internal delays of the inverter-delay circuits used within the particular stage.

In another aspect of the invention, more than one one-shot pulse output is used. For example, all of the one-shot pulse outputs $O_{o1}$-$O_{o3}$ may be superimposed to produce a pulse train as depicted in FIG. 4(h). Using such an arrangement, a system clock of arbitrary pulse signals may be generated.

Figure 5:
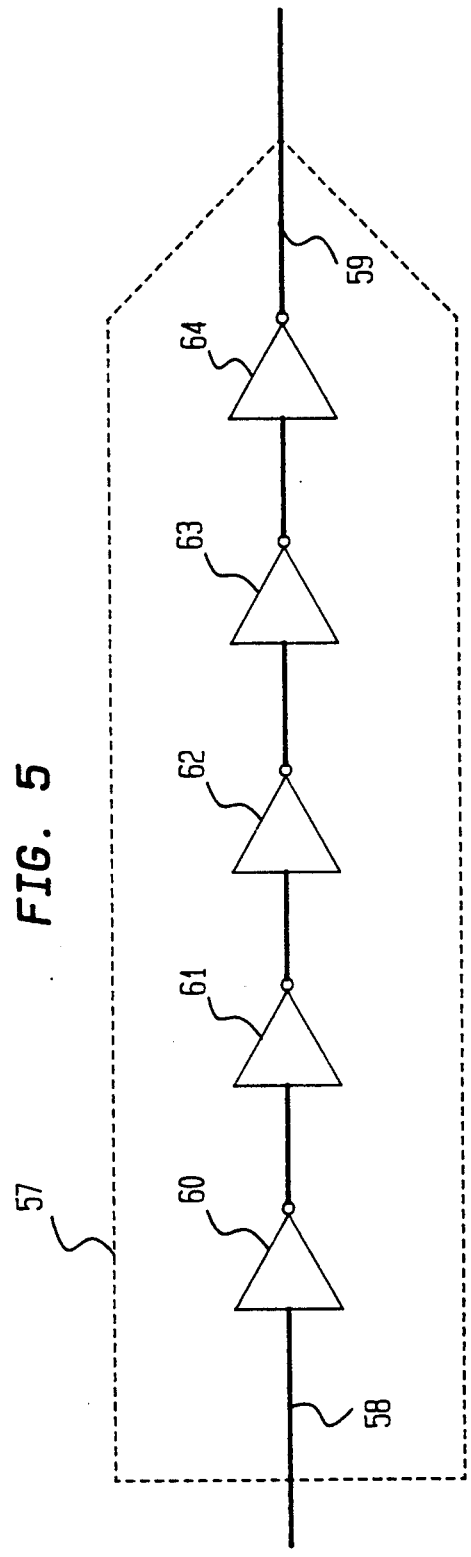
FIG. 5 schematically depicts an exemplary inverter-delay circuit comprised in the stage depicted in FIG. 1.

Turning now to FIG. 5, the structure of a particular inverter-delay circuit 57 is now discussed. As depicted therein, five inverters 60-64 are connected in tandem, with the signal input to the inverter-delay circuit 57 appearing on line 58 and the output signal emerging on line 59. The first two inverters 60, 61 are wave form shaping inverters. They do not have very long delay times and typically contribute little to the overall propagation delay of the system. Rather, these inverters serve to shape the input wave form so that the propagation delay time of the inverter-delay circuit does not depend on the input signal. Similarly, the last inverter 64 is a buffering inverter which serves to isolate the inverter-delay circuit from the output load so that the output load does not influence the delay time.

Most of the delay time results from the remaining two inverters 62-63 which illustratively are both P-NMOS unbalanced inverters. For example, the third inverter 62 may have a minimum size PMOS and a long channel NMOS transistor and the fourth inverter 63 may have a minimum size NMOS and a long channel PMOS transistor. The respective channel lengths may be manufactured to achieve a particular propagation delay. Unbalanced P-NMOS inverters are preferred because they do not influence the noise margin of the circuit, do not cause an input "glitch" and reduce the "setup" time of the one-shot circuit.

Finally, the aforementioned embodiments are intended to be merely illustrative of the invention. Numerous other embodiments may be devised by those ordinarily skilled in the art without departing from the spirit and scope of the following claims.

I claim:

1. A cascadable multi-pulse generator stage for generating a one-shot pulse signal and a delayed trigger signal comprising:

a first pulse signal generating means for generating a first one-shot pulse signal in response to an external trigger signal inputted to said stage, said first one-shot pulse signal being used to provide a one-shot pulse output of said multi-pulse generator stage;

a second pulse signal generating means, responsive to said first one-shot pulse signal, for generating a second one-shot pulse signal delayed from said first one-shot pulse signal by a fixed internal delay; and a trigger signal generating means responsive to said first and second pulse signal generating means for generating a trigger pulse having a period approximately equal to the sum of the periods of said first and second pulse signals, said trigger pulse signal being used to provide a trigger pulse output of said multi-pulse generator stage.

2. The cascadable multi-pulse generator stage of claim 1 wherein said one-shot pulse signal of said first and second pulse signal generating means comprises an approximately square impulse having a width approximately equal to an internal delay of said respective pulse generating means comprised within said multi-pulse generator stage.

3. The cascadable multi-pulse generator stage of claim 1 wherein each of said pulse signal generating means comprises:

a NAND gate having a first input connected to an input of said pulse signal generating means; and an inverter-delay circuit connected to said input of said pulse generating means and having an output connected to a second input of said NAND gate;

wherein said NAND gate outputs a pulse having a width approximately equal to the propagation delay of said inverter-delay circuit, in response to a particular digital signal appearing at said input of said pulse generating means.

4. The cascadable multi-pulse generator stage of claim 1 wherein each of said trigger signal generating means comprises a NAND gate having inputs respectively connected to said first and second pulse signal generating means outputs.

5. The cascadable multi-pulse generator stage of claim 3 wherein each inverter-delay circuit of said pulse signal generators comprises:

- a wave shaping inverter, connected to an input of said inverter-delay circuit, for preventing said inputted signal from influencing the delay of said inverter-delay circuit;
- at least one unbalanced NMOS-PMOS inverter connected to said wave shaping inverter for delaying said input signal; and
- a buffering inverter connected to said at least one unbalanced NMOS-PMOS inverter and having an output connected to an output of said inverter-delay circuit for isolating the inverter-delay circuit from an output load connected to said buffering inverter.

6. A cascadable multi-pulse generator comprising at least two one-shot pulse generator stages connected in series, each stage capable of generating a one-shot pulse signal and a delayed trigger signal and each stage comprising:

- a first pulse signal generating means for generating a first one-shot pulse signal in response to an external trigger signal inputted to said stage, said first one-shot pulse signal being used to provide a one-shot pulse output of its respective multi-pulse generator stage;
- a second pulse signal generating means, responsive to said first pulse signal generating means, for generating a second one-shot pulse signal delayed from its respective first one-shot pulse signal by a fixed internal delay; and
- a trigger signal generating means responsive to said first and second pulse signal generating means for generating a trigger pulse having a period approximately equal to the sum of the periods of said first and second pulse signals, said trigger pulse signal being used to provide a trigger pulse output of its respective multi-pulse generator stage, wherein each antecedent stage receives, as an external trigger input signal, the trigger pulse output from the stage which precedes it so that the trigger pulse output and one-shot pulse signal output from each antecedent stage approximately begin at the end of said trigger pulse output of the preceding stage, and wherein said one-shot pulse signal output of the last stage being used to provide an output of said cascadable multi-pulse generator.

7. A system clock generator comprising a plurality of cascaded multi-pulse generator stages, each stage comprising:

- a first pulse signal generating means for generating a first one-shot pulse signal in response to an external trigger signal inputted to said stage, said first one-shot pulse signal being used to provide a one-shot pulse output of said multi-pulse generating stage;
- a second pulse signal generating means, responsive to said first pulse signal generating means, for generating a second one-shot pulse signal delayed from said first one-shot pulse signal by a fixed internal delay; and
- a trigger signal generating means, responsive to said first and second pulse signal generating means, for generating a trigger pulse having a period approximately equal to the sum of the periods of said first and second pulse signals, said trigger pulse being used to provide a trigger pulse output of said multi-pulse generator stage, wherein each antecedent stage receives, as an external trigger input signal, the trigger pulse output from the stage which precedes it so that the one-shot pulse and trigger pulse outputs of each antecedent stage begin approximately at the end of the trigger pulse output of said preceding stage, and wherein a plurality of said one-shot pulse outputs are superimposed to form a system clock signal.

* * * * *